United States Patent
Malone

(10) Patent No.: US 7,479,831 B2
(45) Date of Patent: Jan. 20, 2009

(54) CLASS AB DIFFERENTIAL CURRENT CONVEYOR INPUT STAGE FOR A FULLY DIFFERENTIAL CURRENT FEEDBACK AMPLIFIER

(75) Inventor: Robert A. Malone, Fort Collins, CO (US)

(73) Assignee: National Semiconductor Corporation, Santa Clara, CA (US)

(*) Notice: Subject to any disclaimer, the term of this patent is extended or adjusted under 35 U.S.C. 154(b) by 107 days.

(21) Appl. No.: 11/601,271

(22) Filed: Nov. 16, 2006

(65) Prior Publication Data

US 2008/0116975 A1 May 22, 2008

(51) Int. Cl.
*H03F 3/45* (2006.01)
(52) U.S. Cl. ....................................... 330/257
(58) Field of Classification Search ................. 330/252, 330/257, 258
See application file for complete search history.

(56) References Cited

U.S. PATENT DOCUMENTS

| | | | |
|---|---|---|---|
| 5,146,179 A | 9/1992 | Carley et al. | |
| 5,734,294 A * | 3/1998 | Bezzam et al. | 327/552 |
| 6,181,204 B1 * | 1/2001 | Smith et al. | 330/261 |
| 6,636,116 B2 | 10/2003 | Cameron | |
| 6,639,456 B2 * | 10/2003 | Paulus | 327/545 |

OTHER PUBLICATIONS

"A Minimal Integral Nonlinearity Criterion to Optimize the Design of new tanh/sinh-Type Bipolar Transconductor" Sanchez, et al. IEEE Transactions on Circuits and Systems vol. 49, No. 8 Aug. 2002.
"A sinh Resistor and Its Application to tanh Linearization" Tavakoli, et al. IEEE Journal of Solid-State Circuits, Vo. 40, No. 2, Feb. 2005.
"A BiCMOS Low-Distortion 8-MHz Low-Pass Filter" Willingham, et al. IEEE Journal of Solid-State Circuits, vol. 28, No. 12, Dec. 1993.

* cited by examiner

*Primary Examiner*—Steven J Mottola

(57) ABSTRACT

Disclosed herein is technology for, among other things, a current feedback fully differential amplifier. The amplifier includes an input stage operable to sense an input current at a first terminal and a second terminal. The input stage includes a first buffer having an input coupled with the first terminal and an output coupled with said the terminal. The input stage further includes a second buffer having an output coupled with the first terminal and an input coupled with the second terminal.

26 Claims, 8 Drawing Sheets

CLASS AB DIFFERENTIAL CURRENT CONVEYOR INPUT STAGE FOR A FULLY DIFFERENTIAL CURRENT FEEDBACK AMPLIFIER

BACKGROUND

1. Field

Embodiments of the present invention relate generally to the field of feedback amplifiers.

2. Background

The fully differential amplifier (FDA) has become a key component in signal processing applications where high speed and signal fidelity are essential system requirements. Advantages offered by fully differential amplifiers over single ended amplifiers include inherent resistance to external noise sources, reduced even order harmonics, and increased dynamic range. FIG. 1 shows a circuit 100 illustrating a general purpose FDA 110 in a typical data acquisition application. Within the scope of this discussion, the term "general purpose" will refer to an amplifier circuit generally having the following properties: 1) a pair of differential inputs, $v_{ip}$ and $v_{im}$; 2) a pair of differential outputs, $v_{op}$ and $v_{om}$; 3) a common mode reference input, $v_{cm}$, to control the common mode voltage level at the FDA's outputs; 4) a feedback network external to the chip (i.e., user configurable gain); 5) the ability to DC couple both inputs and outputs; and 6) the ability to drive the closed loop FDA from either a differential or single ended source. The FDA in this example shall be considered ideal, meaning infinite differential open loop gain and input impedance across the frequency domain. The closed loop gain of circuit 100, assuming an ideal FDA 110, is given by:

$$v_{o,dm} = \frac{2}{f_1 + f_2} * [v_{sp}(1 - f_1) - v_{sm}(1 - f_2)], \quad (1)$$

where $v_{o,dm}$, the differential mode output voltage, is defined as $$v_{o,dm} \equiv v_{op} - v_{om}, \quad (2)$$

$f_1$ and $f_2$ are the respective gain factors for positive and negative feedback networks $$f_x = \frac{R_{gx}}{R_{fx} + R_{gx}}, \quad (3)$$

and $v_{sp}$ and $v_{sm}$ refer to the positive and negative terminals of the source. For the balanced feedback network case, $R_{f1}=R_{f2}=R_f$ and $R_{g1}=R_{g2}=R_g$, and Equation 1 reduces to:

$$v_{o,dm} = v_{s,dm} * \left(\frac{R_f}{R_g}\right), \quad (4)$$

where $$v_{s,dm} \equiv v_{sp} - v_{sm}. \quad (5)$$

The output common mode voltage level, defined as $$v_{o,cm} \equiv \frac{(v_{op} + v_{om})}{2}, \quad (6)$$

is controlled by means of a separate integrated amplifier circuit. The inverting terminal of this amplifier is connected to both output terminals of the FDA through a matched resistive divider network while the non-inverting terminal is connected to a reference voltage, $V_{cm}$. The closed loop gain of this amplifier, usually referred to as the common mode feedback amplifier (CMFB), is set to unity in most FDA integrated circuits.

FIG. 2 illustrates one possible implementation of the FDA 110 of FIG. 1. The architecture in FIG. 2 is based on a voltage feedback approach. Using this architecture, the balanced FDA gain relationship given in Equation 4 becomes:

$$v_{o,dm} = v_{s,dm} * \left(\frac{R_f}{R_g}\right)\left[\frac{1}{1 + \frac{1}{2G_{dm}(s)Z_t(s)f}}\right]. \quad (9)$$

This is the conventional closed loop gain expression for a linear voltage feedback FDA with finite open loop gain, where $G_{dm}(s)$ is the transconductance of the differential input stage 210, and $Z_t(s)$ is the transimpedance gain of each half of the forward amplifier's signal path.

The amplifier's loop gain is given by:

$$T(s)=2G_{dm}(s)Z_t(s)f. \quad (10)$$

This equation reveals the fundamental limitation of voltage feedback amplifier architectures, whether differential or single ended out, which is the direct proportionality of loop gain to the feedback factor f. As closed loop gain is increased (i.e., f is decreased), the loop gain is reduced, resulting in a corresponding reduction in closed loop bandwidth.

Another limitation of the voltage feedback FDA architecture depicted in FIG. 2 is the sensitivity of its high impedance inputs to parasitic capacitance at the $v_{ip}$ and $v_{im}$ nodes. Analysis of the circuit of FIG. 2, introducing capacitors $C_{ip}$ and $C_{im}$ at $v_{ip}$ and $v_{im}$ respectively and ground, shows that the loop gain equation is modified by an additional high frequency pole:

$$T(s) = \frac{2G_{dm}(s)Z_t(s)f}{(1 + sC_iR_{eq})}, \quad (11)$$

where it is assumed for simplicity that $C_{ip}=C_{im}=C_i$ and $R_{eq}$ is simply $R_f \| R_g$. Typically, the parasitic capacitance contributions from PCB, package, and ESD protection circuits can add up to 1-2 pF. For example, a FDA configured for a gain of +1, with $R_f$ equal to 500 ohms, will exhibit a parasitic pole between 318 MHz and 636 MHz. Any attempt to improve bandwidth by decompensation of the open loop amplifier will be limited by the loss of phase margin in the vicinity of this pole frequency.

The noise power spectral density at the differential output of the FDA is given by the following equation, where contributions from the resistive feedback network elements have been ignored for simplicity.

$$Pn_o = \frac{(2Vn_i)^2 + (2In_{ip}R_{eq1})^2 + (2In_{im}R_{eq2})^2 + (2Vn_{cm}(f_1 - f_2))^2}{(f_1 + f_2)^2} \quad (7)$$

$Vn_i$ is the input referred voltage noise, $In_{ip}$ and $In_{im}$, are the input referred current sources at the positive and negative input terminals respectively, and $Vn_{cm}$ is the input referred noise of the CMFB amplifier. $R_{eqx}$ is defined as $R_{fx}\|R_{gx}$. If the feedback networks are balanced, the noise equation reduces to:

$$Pn_o = \frac{(2Vn_i)^2 + (2R_{eq})^2 * (In_{ip}^2 + In_{im}^2)}{(2f)^2}. \qquad (8)$$

Since the differential input to the voltage feedback FDA is high impedance, the noise contribution from circuit elements referred to the input as voltage sources will usually dominate the differential noise spectral density at the FDA output. The noise gain of the voltage feedback FDA will be proportional to the closed loop amplifier's feedback factor f.

$$Pn_o = \frac{Vn_i^2}{f^2}$$

Thus, operation at higher signal path gains will necessarily be accompanied by higher noise levels at the FDA outputs.

In addition to voltage feedback, current feedback techniques have been applied in the design of high speed single ended output op-amps for a number of years. Advantages of current feedback (CFB) op-amps over their voltage feedback (VFB) counterparts include gain-bandwidth independence, generally higher slew rates, and improved even order non-linearity rejection. These performance benefits usually come at the price of less precision, smaller input common mode voltage range, and higher inverting input referred noise current. CFB techniques have not easily migrated to FDAs, primarily due to the difficulty in developing practical, low input impedance, fully differential input stage architectures with good common mode voltage rejection. However, the case for integrating current feedback techniques into the design of fully differential amplifiers is becoming more and more compelling as the demands of data acquisition systems continue to drive signal path components to provide high signal fidelity across much wider system bandwidths.

Previous attempts at designing a current feedback FDA have involved using two single-ended CFB amplifiers to form a differential amplifier. For example, U.S. Pat. No. 6,636,116, entitled "FULLY DIFFERENTIAL CURRENT FEEDBACK AMPLIFIER" and assigned to Texas Instruments Incorporated, discloses a CFB FDA that develops a differential low impedance input from the outputs of a pair of buffers, both referenced to a potential at their respective high impedance inputs. However, a dual, "un-balanced" input approach such as this results in an input stage that cannot discriminate between differential and common mode signals. In order to correct the balance error that results from such an implementation, the interfering input common mode signal must be cancelled elsewhere in the circuit. This is achieved by means of an additional circuit that replicates and 180° phase shifts the output current from one input buffer and combines it with the output current from the other, and vice versa. Moreover, in single ended input to differential output applications, where the common mode voltage at the FDA inputs is "boot strapped" to the differential voltage at the FDA outputs, holding the input buffer inputs to a fixed reference voltage could cause heavy current loading on each of the input buffers, and therefore introduce a significant distortion in the input stages of these circuits.

SUMMARY

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

Disclosed herein is technology for, among other things, a current feedback fully differential amplifier. The amplifier includes an input stage operable to sense an input current at a first terminal and a second terminal. The input stage includes a first buffer having an input coupled with the first terminal and an output coupled with said the terminal. The input stage further includes a second buffer having an output coupled with the first terminal and an input coupled with the second terminal.

Thus, embodiments are able to achieve fully differential current feedback amplifiers, as opposed to amplifiers that use dual single-ended output topography. As a consequence, embodiments have inherent common mode signal rejection. In other words, the sensitivity of input stages of some embodiments to common mode voltage is small and due entirely to a second order effect. Thus, embodiments are able to achieve very low harmonic distortion even in the presence of significant common mode interference. Furthermore, embodiments are able to achieve high gains without sacrificing bandwidth and noise performance. Additionally, embodiments have reduced sensitivity to parasitic capacitances at the input, which moves a higher order parasitic system pole further up in frequency.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Generally speaking, embodiments of the present invention are directed to current feedback fully differential amplifiers. In other words, embodiments are able to achieve a true differential input/output amplifier, as opposed to two single-ended input/output amplifiers. Embodiments are able to achieve a true differential input/output amplifier by incorporating input stages discussed below.

Figure 2:
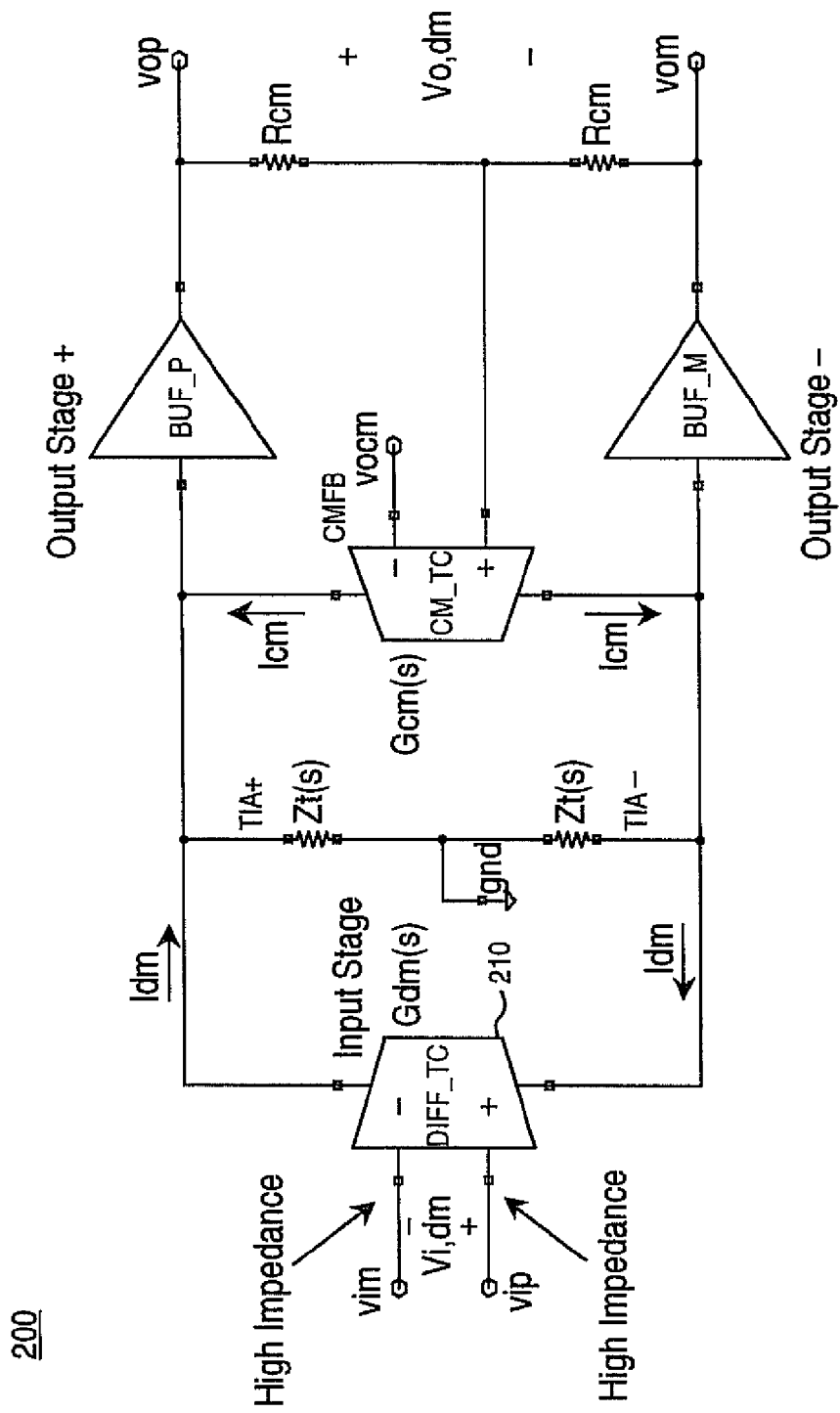
FIG. 2 illustrates one possible implementation of the fully differential amplifier of FIG. 1.
Figure 3:
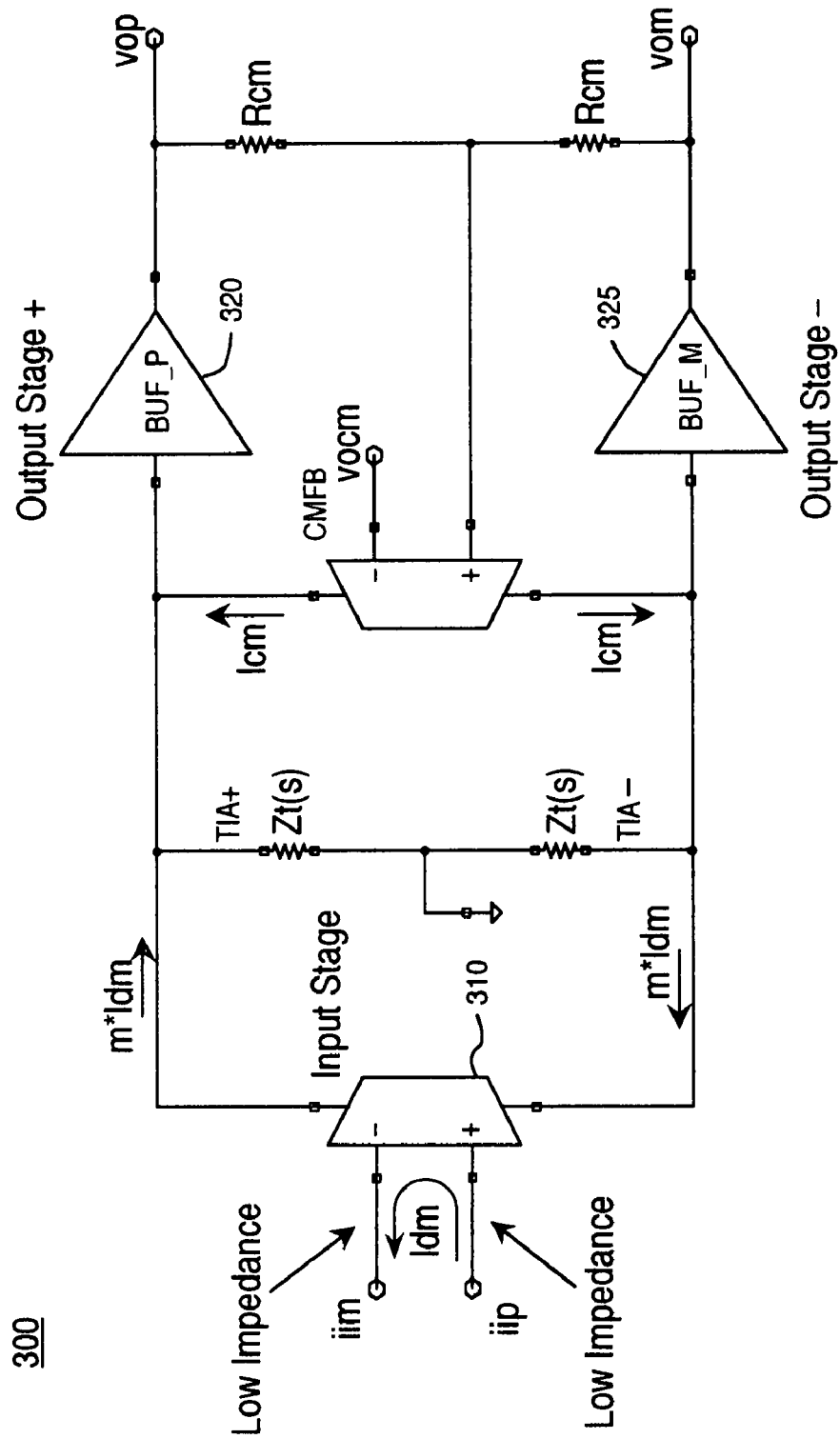
FIG. 3 illustrates a block diagram of an amplifier that employs current feedback architecture, in accordance with various embodiments of the present invention.

FIG. 3 illustrates a block diagram of an amplifier 300 that employs a CFB architecture, in accordance with various embodiments of the present invention. One difference between the amplifier 300 and the VFB architecture shown in FIG. 2 is that amplifier 300 uses what will be hereinafter referred to as a differential current conveyor 310, rather than the differential input transconductor 210 of FIG. 2. In one embodiment, the differential current conveyor 310 is, in effect, a current dependent current source where the differential input current is sensed through a pair of low impedance (ideally zero) inputs and replicated (or "conveyed") at a high impedance differential output. Each sense of the differential output current is then fed into one of a pair of transimpedance amplifiers (TIAs), one corresponding to the "+" output (i.e., TIA+), and the other to the "−" output (i.e., TIA−). The high impedance nodes are isolated from the external loading environment at the differential output by a pair of high speed, high input impedance buffers 320 and 325.

Figure 1:
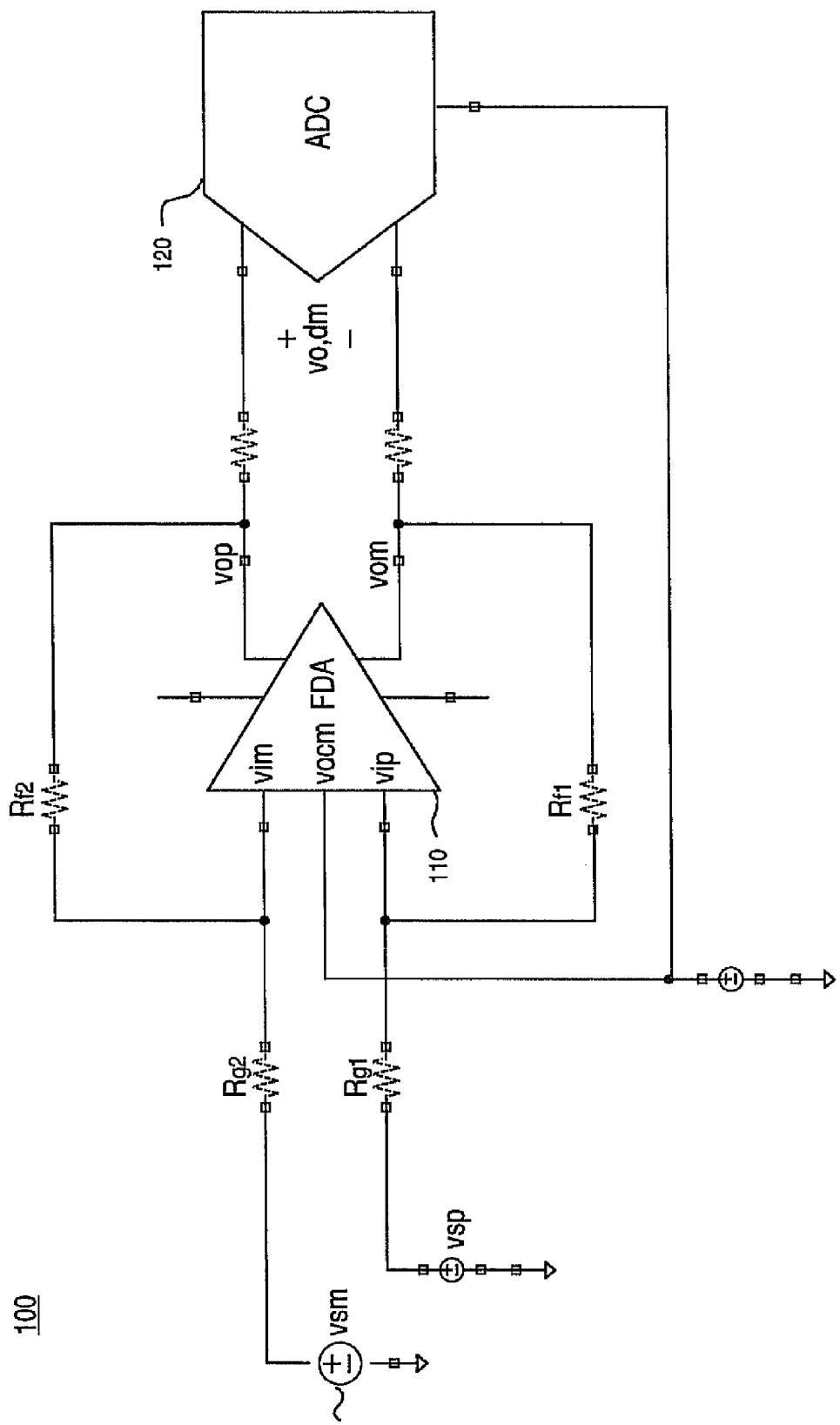
FIG. 1 shows a circuit illustrating a general purpose fully differential amplifier in a typical data acquisition application.

The equations governing the closed loop response of CFB FDA 300 are developed in the following analysis. For simplicity it is assumed once again that:

$$R_{f1}=R_{f2}=R_f \quad (12)$$

$$R_{g1}=R_{g2}=R_g, \quad (13)$$

and that $V_{cm}$ is set to ground. It will also be assumed that the differential input has a small non-zero series resistance, $r_{id}$, associated with it. Substituting the CFB FDA 300 of FIG. 3 for the generic FDA 110 of FIG. 1 and performing the same nodal analysis as above yields the following equations for the voltages at the inputs of CFB FDA 300:

$$v_{ip}=v_{om}*f+v_{sp}*(1-f)-i_{dm}*R_{eq}; \quad (13)$$

$$v_{im}=v_{op}*f+v_{sm}*(1-f)+i_{dm}*R_{eq}. \quad (14)$$

Subtracting Equation 13 from Equation 14, and using the definitions for differential source and output signals gives:

$$v_{ip}-v_{im}=v_{o,dm}*f+v_{s,dm}*(1-f)-2i_{dm}*R_{eq}. \quad (15)$$

Inspection of FIG. 3 shows that:

$$v_{ip}-v_{im}=i_{dm}*R_{id}. \quad (16)$$

Substituting this into Equation 15 and rearranging gives:

$$v_{o,dm} = v_{s,dm} * \left[\frac{1-f}{f}\right] - i_{dm} * \left[2R_f + \frac{r_{id}}{f}\right]. \quad (17)$$

The differential output voltage, $v_{o,dm}$, is related to the differential input current, $i_{dm}$, by the amplifier's open loop transimpedance multiplied by the input current mirror gain:

$$v_{o,dm}=i_{dm}*2mZ_t(s). \quad (18)$$

Solving for $i_{dm}$ and substituting into Equation 17 gives the gain equation for a closed loop current feedback FDA (such as CFB FDA 300):

$$v_{o,dm} = v_{s,dm} * \left(\frac{R_f}{R_g}\right)\left[\frac{1}{1+\frac{2R_f + \frac{r_{id}}{f}}{2mZ_t(s)}}\right]. \quad (19)$$

This is a linear feedback equation identical to that for the VFB case except that now the loop gain is given by:

$$T(s) = \frac{2mZ_t(s)}{2R_f + \frac{r_{id}}{f}}. \quad (20)$$

It should be appreciated that if the input impedance of the differential current conveyor input stage is small compared to $R_f$, varying the feedback factor f will have little or no effect on the loop gain of FDA 300, except at small f. An alternate way of stating this result is that the closed loop bandwidth of FDA 300 is proportional to the size of the feedback resistor $R_f$, rather than to the value of the closed loop gain. In one embodiment, the CFB FDA 300 can therefore be configured to simultaneously provide both high signal path bandwidth and high gain with a suitable choice of feedback resistor—a unique property of the CFB architecture.

As stated above, VFB FDAs are sensitive to input capacitance, which limits the maximum achievable bandwidth of the VFB FDA. Proceeding as above, with the inclusion of $C_{ip}$ and $C_{im}$ in the nodal equations for $v_{ip}$ and $v_{im}$ respectively, results in the new loop gain equation shown below:

$$T(s) = \frac{2mZ_t(s)}{\left(2R_f + \frac{r_{id}}{f}\right)(1 + sC_pR_{eq}\|r_{id})}. \quad (21)$$

Note that the pole due to the parasitic capacitance at the inputs is now:

$$p_{2,CFB} = \frac{1}{2\pi C_p R_{eq} \| r_{id}}, \quad (22)$$

compared to:

$$p_{2,VFB} = \frac{1}{2\pi C_p R_{eq}} \quad (23)$$

for the VFB architecture. This represents a pole frequency shift of:

$$C = \frac{R_{eq} + r_{id}}{r_{id}}. \quad (24)$$

With the assumption that $r_{id} \ll R_{eq}$, and that the other system poles occur at much higher frequencies yet, the maximum achievable closed loop bandwidth of the current feedback FDA 300 is extended by the same factor.

The noise response for the closed loop CFB FDA 300 is identical to that given by Equation 7 for the VFB FDA 200. However, since the input impedance of the CFB FDA 300 is low, circuit noise elements referred to the inputs as current sources will dominate the amplifier's noise response. If the noise contribution from the input referred voltage source can be ignored, and assuming small $r_{id}$ and matched feedback, Equation 7 reduces to $$Pn_0 \cong \frac{(In_{ip}^2 + In_{im}^2) R_{eq}^2}{f^2} \quad (25)$$

Using the definitions of $R_{eq}$ and f given earlier, Equation 25 further reduces to $$Pn_o = (In_{ip}^2 + In_{im}^2) Rf^2 \quad (26)$$

Equation 26 demonstrates an important and useful property of the current feedback FDA architecture. Unlike the voltage feedback FDA noise response described earlier, the noise gain of the closed loop current feedback FDA is not proportional to the magnitude of the signal gain; rather it depends only on the size of the feedback resistor. This is an important result for many differential signaling applications that require high signal path gain but low noise figure.

Figure 4:
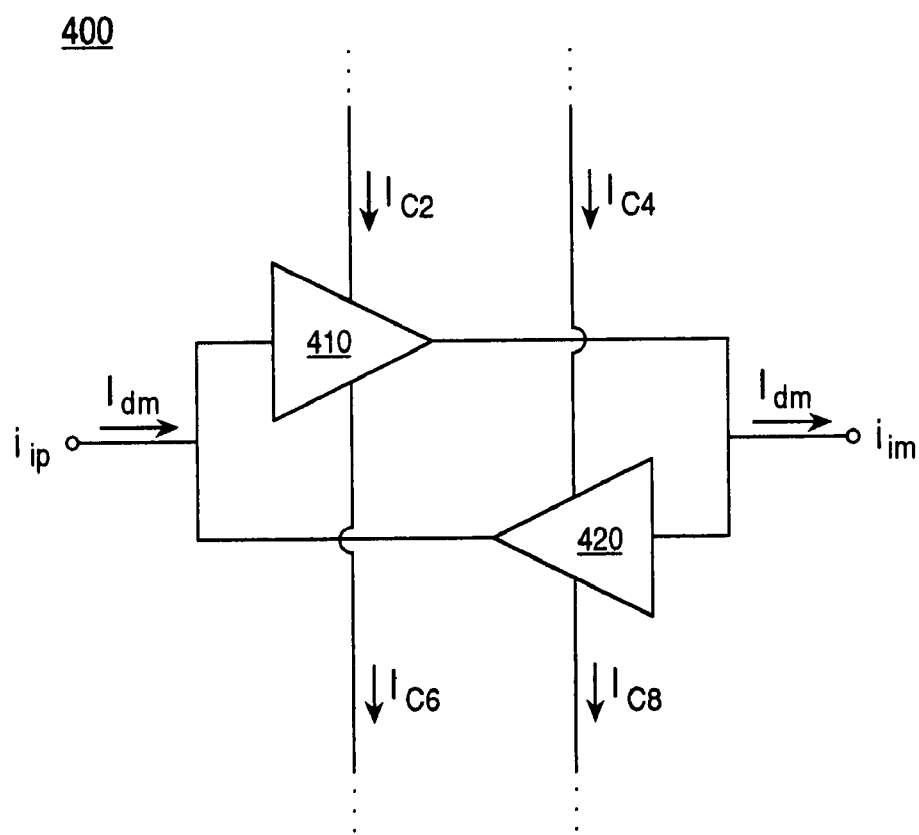
FIG. 4 illustrates an input stage for a current feedback fully differential amplifier, in accordance with various embodiments of the present invention.

FIG. 4 illustrates an input stage 400 for a current feedback fully differential amplifier (such as CFB FDA 300), in accordance with various embodiments of the present invention. Input stage 400 may also be referred to as a differential current conveyor. In one embodiment, input stage 400 includes a pair of back-to-back connected (i.e., the output of each is connected to the input of the other) open loop buffers 410 and 420. It should be appreciated that additional buffers connected in a similar fashion may be used. Because buffers 410 and 420 are connected in a back-to-back fashion, they are self-biasing. In other words, buffers 410 and 420 do not need to be referenced to an external potential. Additionally, since such buffers tend to have low impedance outputs and high impedance inputs, connecting buffers 410 and 420 in this manner creates a virtual low impedance path between the two terminals, $i_{ip}$ and $i_{im}$. In one embodiment, an increase in $i_{dm}$ in the direction indicated is reflected as increases in $i_{C2}$ and $i_{C8}$ and decreases in $i_{C4}$ and $i_{C6}$. Thus, the differential current $i_{dm}$ at the inputs of the input stage 400 creates corresponding differential currents at the outputs of the input stage 400.

Figure 5:
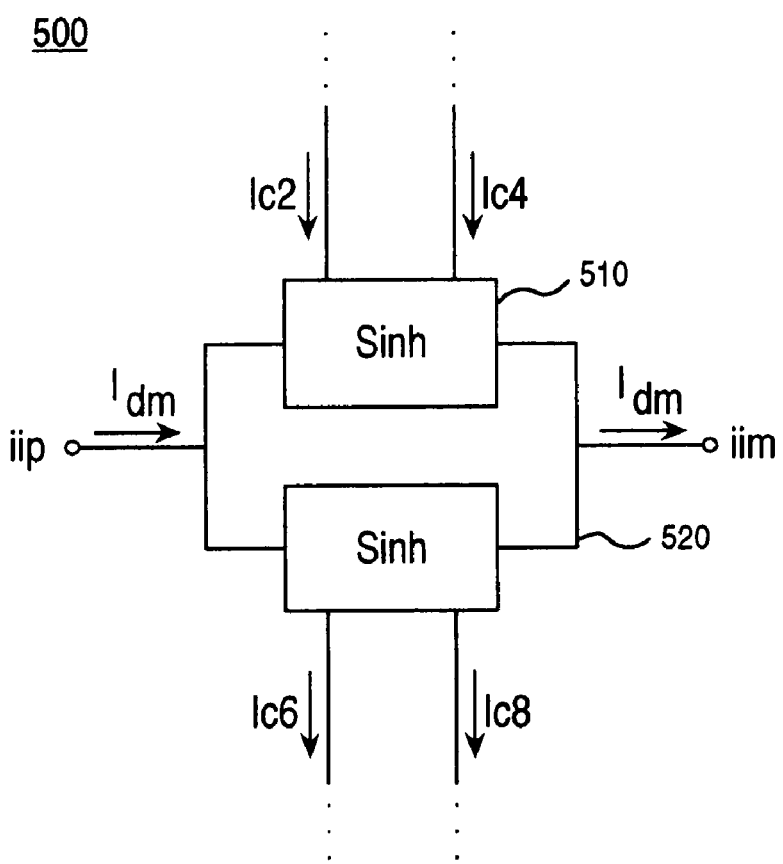
FIG. 5 illustrates an alternative input stage for a current feedback fully differential amplifier, in accordance with various embodiments of the present invention.

FIG. 5 illustrates another input stage 500 for a current feedback fully differential amplifier (such as CFB FDA 300), in accordance with various embodiments of the present invention. Input stage 500 may also be referred to as a differential current conveyor. In one embodiment, input stage 500 includes a pair of hyperbolic sine transconductors 510 and 520, where transconductor 520 is complementary to transconductor 510. Hyperbolic sine transconductors 510 and 520 have a sinh I-V transfer characteristic. It should be appreciated that additional sinh transconductors connected in a similar fashion may be used. Additionally, the configuration of transconductors 510 and 520 maintains a virtual low impedance path between the two terminals, $i_{ip}$ and $i_{im}$. In one embodiment, an increase in $i_{dm}$ in the direction indicated is reflected as increases in $i_{C2}$ and $i_{C8}$ and decreases in $i_{C4}$ and $i_{C6}$. Thus, the differential current $i_{dm}$ at the inputs of the input stage 500 creates corresponding differential currents at the outputs of the input stage 500.

Figure 6:
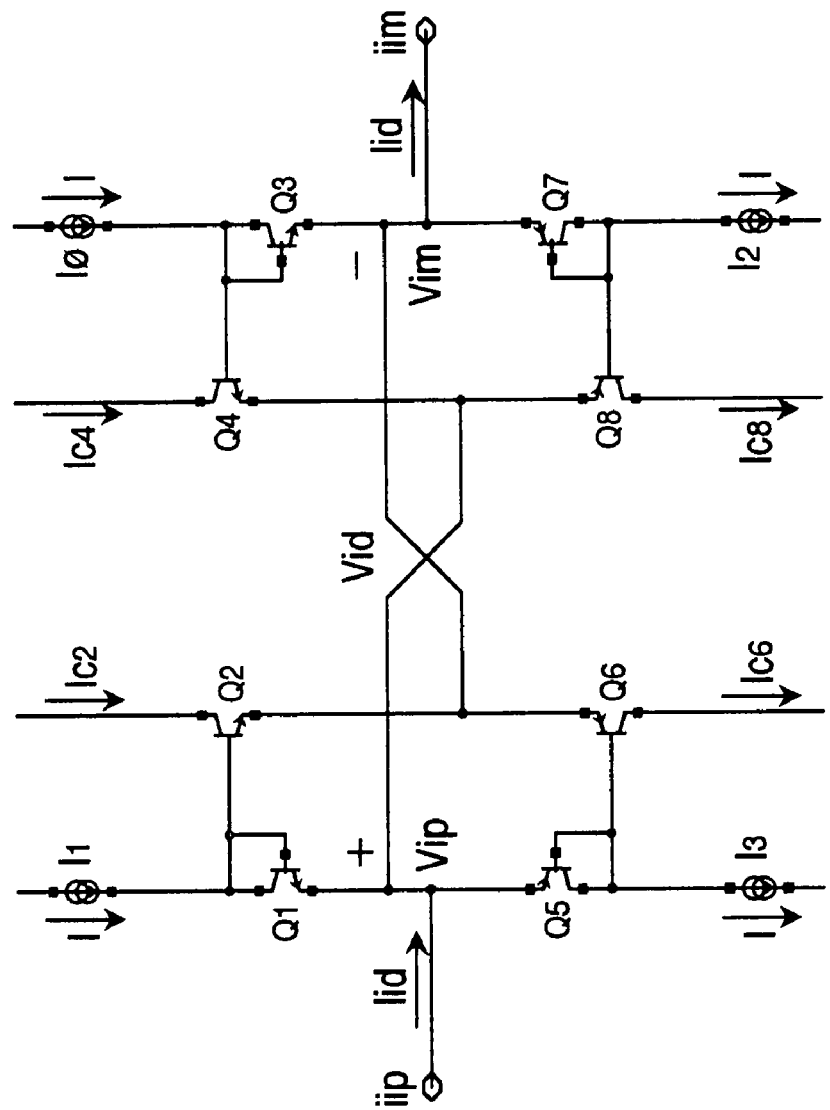
FIG. 6 illustrates an exemplary input stage for a current feedback fully differential amplifier, in accordance with various embodiments of the present invention.

FIG. 6 illustrates an exemplary input stage 600 for a current feedback fully differential amplifier (such as CFB FDA 300), in accordance with various embodiments of the present invention. In one embodiment, transistors Q1, Q2, Q5, and Q6 form a first four-transistor buffer (such as buffer 410), and transistors Q3, Q4, Q7, and Q8 form a second four-transistor buffer (such as buffer 420). It should be appreciated that buffers such as buffers 410 and 420 may be implemented using different configurations with different numbers of transistors. In another embodiment, transistors Q1-Q4 form a first hyperbolic sine transconductor (such as sinh transconductor 510), and transistors Q5-Q8 form a second hyperbolic sine transconductor (such as sinh transconductor 520), which is complementary to the first hyperbolic sine transconductor (e.g., sinh transconductor 510).

As stated above, the buffering action of each half-circuit maintains a virtual low impedance path between the two terminals, $i_{ip}$ and $i_{im}$. Solving for the currents at nodes $i_{ip}$ and $i_{im}$ gives:

$$i_{dm} + i_{C1} + i_{C4} - i_{C5} - i_{C8} = 0; \text{ and} \quad (27)$$

$$i_{dm} + i_{C6} + i_{C7} - i_{C2} - i_{C3} = 0, \quad (28)$$

where base currents have been ignored for simplicity. Summing Equation 27 and Equation 28 and recognizing that:

$$i_{C1} = i_{C3} = i_{C5} = i_{C7} = I_{S1} \quad (29)$$

yields the following relationship between the differential input current and the differential collector output currents from the complimentary half circuits:

$$[i_{C2} - i_{C4}] - [i_{C6} - i_{C8}] = 2 i_{dm} \quad (30)$$

or $$i_{o,dm} = 2 i_{dm}, \quad (31)$$

where $i_{o,dm}$ is defined as the differential output current between left and right half circuits. The gain of the differential current conveyor 600 is 2. AC analysis of the current conveyor 600 gives the same result as Equation 31 above with the exception that the dependence of the current gain on finite, band limited beta is also shown:

$$i_{o,dm} = 2i_{dm} * \frac{\beta_o}{\beta_o + 2} * \frac{1}{1 + s\frac{2C_\pi r_\pi}{\beta_o + 2}}, \quad (32)$$

where the following notational shorthands have been used:

$$\beta_o = \beta_{pnp} \| \beta_{npn}; \quad (33)$$

$$r_\pi = r_{\pi pnp} \| r_{\pi npn}; \quad (34)$$

$$C_\pi = C_{\pi pnp} + C_{\pi npn}. \quad (35)$$

For good high speed bipolar process technology, frequencies greater than 2 GHz maybe achieved for this pole.

With respect the differential input resistance of input stage 600, application of a differential current will result in a small voltage drop between the input terminals:

$$v_{i,dm} = v_{ip} - v_{im}. \quad (36)$$

There are four distinct diode paths to get from node $v_{ip}$ to node $v_{im}$. Choosing the path formed by Q1 and Q2 gives:

$$v_{i,dm} = V_{BE2} - V_{BE1}, \quad (37)$$

$$v_{i,dm} = V_t \ln\left(\frac{i_{C2}}{i_{C1}}\right), \quad (38)$$

$$v_{i,dm} = V_t \ln\left(\frac{i_{C2}}{i_{S1}}\right). \quad (39)$$

Taking $e^x$ of both sides gives:

$$i_{C2} = I_{S1} * e^{\left(\frac{v_{i,dm}}{V_T}\right)}. \quad (40)$$

A similar equation is established for the path formed by Q5 and Q6:

$$i_{C6} = I_{S1} * e^{-\left(\frac{v_{i,dm}}{V_T}\right)}. \quad (41)$$

Substituting Equations 40 and 41 into Equation 28 gives:

$$i_{dm} = i_{C2} - i_{C6} = I_{S1} * \left[e^{\left(\frac{v_{i,dm}}{V_T}\right)} - e^{-\left(\frac{v_{i,dm}}{V_T}\right)}\right]. \quad (42)$$

Applying the definition of the hyperbolic sine function produces:

$$i_{dm} = i_{C2} - i_{C6} = 2I_{S1} * \sinh\left(\frac{v_{i,dm}}{V_T}\right). \quad (43)$$

Similarly, since $i_{C2} - i_{C6} = i_{C8} - i_{C4}$:

$$i_{dm} = i_{C8} - i_{C4} = 2I_{S1} * \sinh\left(\frac{v_{i,dm}}{V_T}\right). \quad (44)$$

Equations 43 and 44 show the signature I-V transfer characteristic for this class of transconductors. For small x, sin h(x)≈x, so for $v_{i,dm} \ll V_T$ Equation 42 reduces to the approximate relationship:

$$v_{i,dm} \approx i_{dm} * \frac{V_T}{2I}. \quad (45)$$

Differentiating this equation with respect to $i_{dm}$ gives the input resistance of the differential current conveyor 600:

$$r_{id} \equiv \frac{\partial v_{i,dm}}{\partial i_{dm}} = \frac{V_T}{2I}. \quad (46)$$

Figure 7:
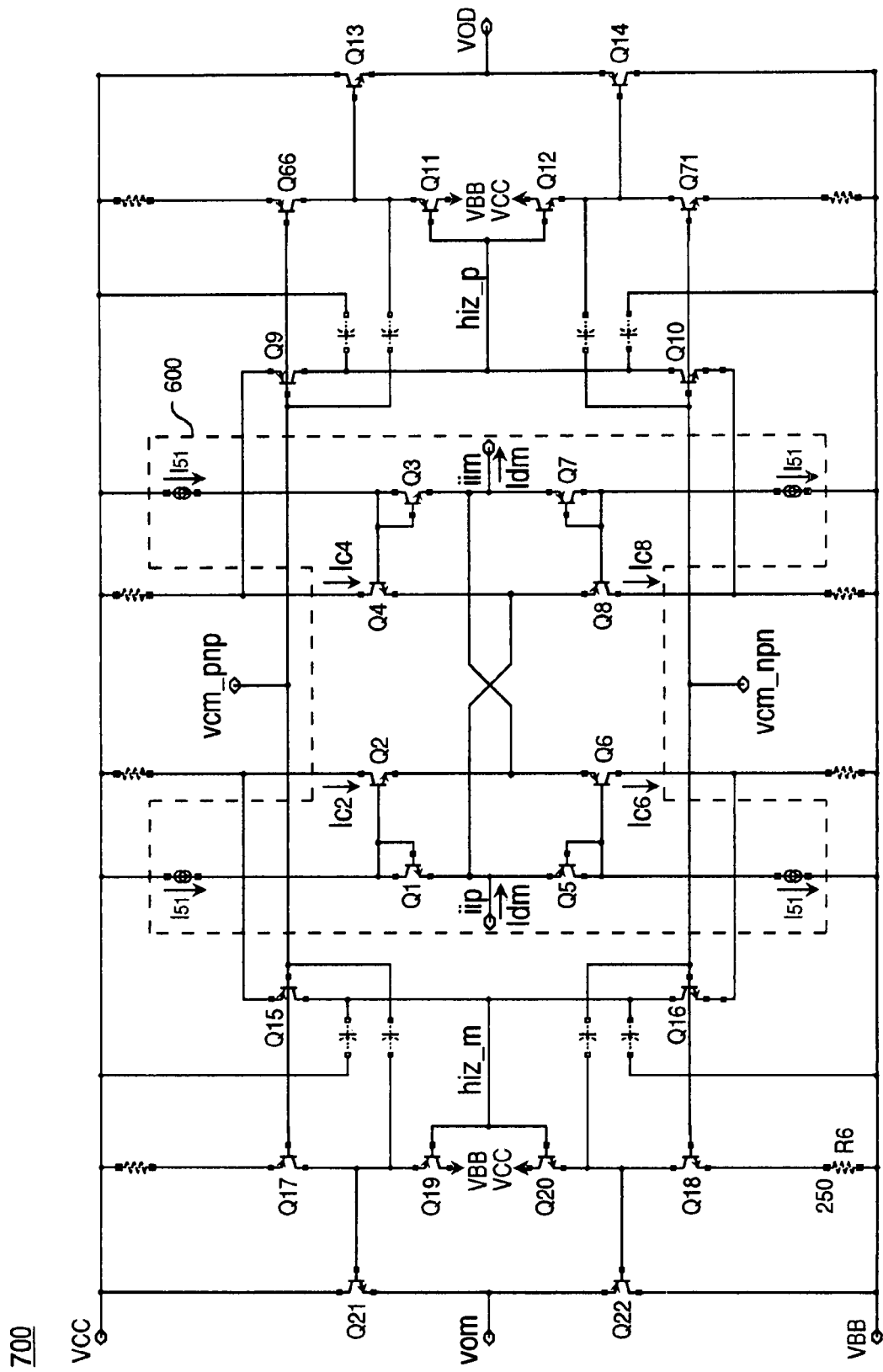
FIG. 7 illustrates a detailed schematic for a current feedback fully differential amplifier, in accordance with various embodiments of the present invention.

FIG. 7 illustrates a schematic for a CFB FDA 700, in accordance with various embodiments of the present invention. CFB FDA 700 includes current conveyor 600 as its input stage. The left half of current conveyor 600 is coupled with folded cascode transistors Q15 and Q16, which together form a first trans-resistor, and the right half of current conveyor 600 is coupled with folded cascode transistors Q9 and Q10, which together form a second trans-resistor.

As stated above, an increase in $i_{dm}$ causes a corresponding increase in $i_{C2}$ and a decrease in $i_{C6}$ with respect to the left half of current conveyor 600. In a similar fashion, an increase in $i_{dm}$ causes a corresponding increase in $i_{C8}$ and a decrease in $i_{C4}$ with respect to the right half of current conveyor 600. Focusing on the left half of FIG. 7, the increased current through Q2 draws current away from Q15. The decreased current through Q15 consequently pushes the voltage at the hiz_m node lower. Simultaneously, the decreased current through Q6 directs more current through Q16, which in turn pulls the voltage at hiz_m lower. Similar but complementary operations occur in the right half of FIG. 7 at transistors Q4, Q8, Q9, and Q10, and node hiz_p, with respect to an increase in $i_{dm}$. Thus, an increase in idm ultimately causes a differential voltage by increasing the voltage at hiz_p and decreasing the voltage at hiz_m. It should be appreciated that the opposite result will occur in response to a decrease in $i_{dm}$. The voltages at nodes hiz_p and hiz_m drive respective output buffers. In one embodiment, transistors Q17-Q22 form a first output buffer and transistors Q11-Q14, Q66 and Q71 form a second output buffer.

To understand how the input resistance of CFB FDA 600 affects the frequency of the pole due to the input capacitance discussed above, consider the following example. If the biasing current $I_{S1}$ is set to 1 mA, the differential input resistance would be about 13 Ohms. If $R_{eq}$=250 Ohms, then the pole due to capacitance at the inputs is shifted up in frequency by a factor of ~19. In this example, using the proposed CFB FDA architecture results in a parasitic pole frequency translation of greater than one decade, preserving the amplifier's phase margin over a much larger system bandwidth than the corresponding voltage feedback architecture.

Figure 8:
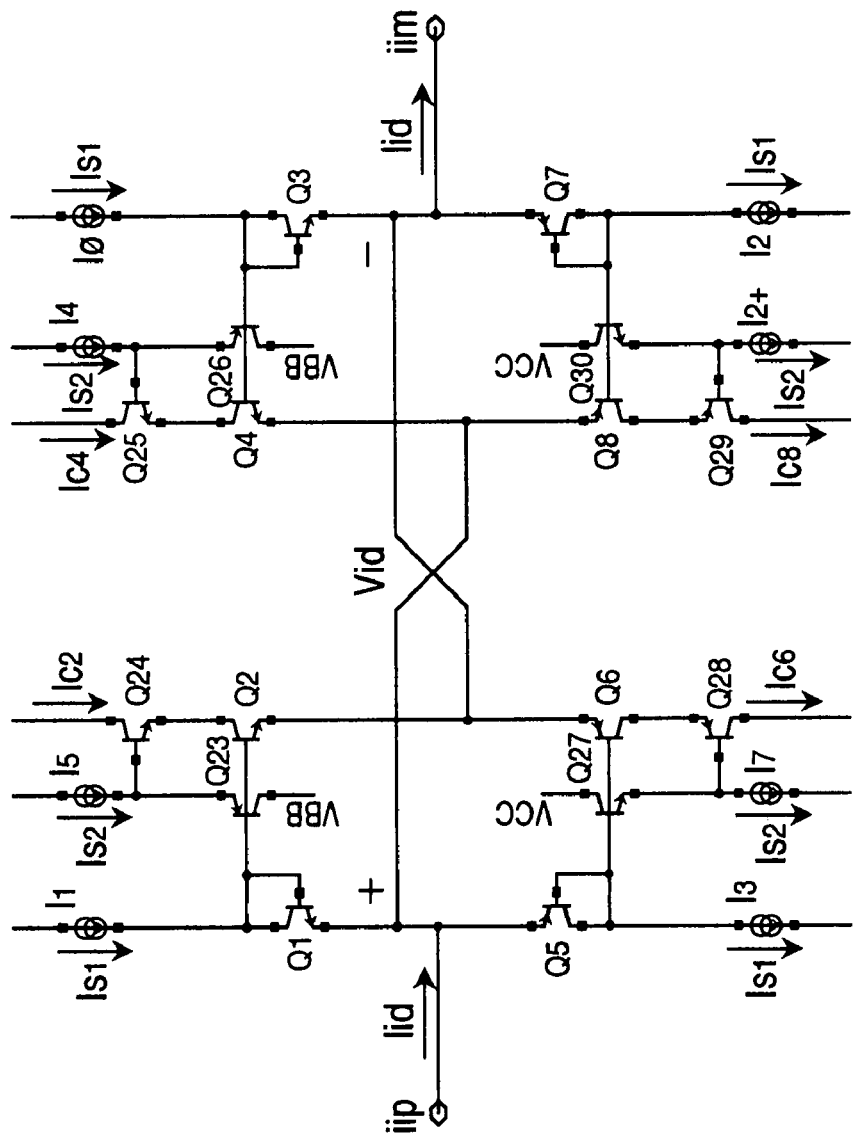
FIG. 8 illustrates a cascode-enhanced input stage for a current feedback fully differential amplifier, in accordance with various embodiments of the present invention.

Further modifications may be made to input stage 600 to improve the circuit's common mode rejection and thus the balance error response of the current feedback FDA. For example, FIG. 8 illustrates a cascode-enhanced input stage 800, in accordance with various embodiments of the present invention. In addition to transistors Q1-Q8, input stage 800 includes transistors Q23-Q24, which form a cascode with Q2, transistors Q25-Q26, which form a cascode with Q4, transistors Q27-Q28, which form a cascode with Q6, and transistors Q29-Q30, which form a cascode with Q8. With the addition of the cascoded transistors, input stage 800 has improved output resistance (ideally high) over input stage 600. However, it should be appreciated that the improved output resistance of input stage 800 comes at the expense of voltage headroom.

Thus, embodiments are able to achieve fully differential current feedback amplifiers, as opposed to amplifiers that use dual single-ended input/output topography. As a consequence, embodiments have inherent common mode signal rejection. In other words, the sensitivity of input stages of some embodiments to common mode voltage is small and due entirely to a second order effect, because embodiments have reduced sensitivity to parasitic capacitances at the input, which moves a system pole further up the spectrum. Consequently, embodiments are able to achieve very low harmonic distortion even in the presence of significant common mode interference. Furthermore, embodiments are able to achieve high gains without sacrificing bandwidth and noise performance.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A current feedback fully differential amplifier, comprising:
   an input stage operable to sense a differential input current at a first terminal and a second terminal, said input stage comprising:
      a first buffer having an input coupled with said first terminal and an output coupled with said second terminal; and
      a second buffer having an output coupled with said first terminal and said input of said first buffer, said second buffer also having an input coupled with said second terminal and said output of said first buffer;
   wherein said first buffer increases a first current and decreases a second current in response to said differential input current increasing, and wherein further said first buffer decreases said first current and increases said second current in response to said differential input current decreasing.

2. The amplifier as recited in claim 1 wherein said first and second buffers bias each other.

3. The amplifier as recited in claim 1 wherein a gain of said amplifier is controllable by an external feedback network.

4. The amplifier as recited in claim 1 wherein said second buffer increases a third current and decreases a fourth current in response to said input current increasing, and wherein further said second buffer decreases said third current and increases said fourth current in response to said input current decreasing.

5. The amplifier as recited in claim 1 wherein said first buffer comprises:
   a first transistor coupled with said first terminal;
   a second transistor coupled with said first transistor and said second terminal;
   a third transistor coupled with said first transistor and said first terminal; and
   a fourth transistor coupled with said second transistor, said third transistor, and said second terminal.

6. The amplifier as recited in claim 5 wherein the current through said second transistor increases and the current through said fourth transistor decreases in response to an increase in said input current, and wherein further the current through said second transistor decreases and the current through said fourth transistor increases in response to a decrease in said input current.

7. The amplifier as recited in claim 5 wherein said first buffer further comprises:
   a fifth transistor coupled with said second transistor, wherein said second and fifth transistors form a first cascode;
   a sixth transistor coupled with said first, second, and fifth transistors;
   a seventh transistor coupled with said third and fourth transistors; and
   an eighth transistor coupled with said fourth and seventh transistors, wherein said fourth and eighth transistors form a second cascode.

8. The amplifier as recited in claim 1 wherein said amplifier is operable at frequencies up to 2 GHz.

9. A current feedback fully differential amplifier, comprising:
   an input stage operable to sense a differential input current at a first terminal and a second terminal, said input stage comprising:
      a first sinh transconductor coupled with said first and second terminals and comprising a first plurality of transistors; and
      a second sinh transconductor coupled with said first and second terminals and said first sinh transconductor and comprising a second plurality of transistors complementary to said first plurality of transistors, wherein a PNP transistor and an NPN transistor are complementary to each other.

10. The amplifier as recited in claim 9 wherein said first sinh transconductor increases a first current and decreases a second current in response to said differential input current increasing, and wherein further said first sinh transconductor decreases said first current and increases said second current in response to said differential input current decreasing.

11. The amplifier as recited in claim 10 wherein said second sinh transconductor increases a third current and decreases a fourth current in response to said differential input current increasing, and wherein further said second sinh transconductor decreases said third current and increases said fourth current in response to said differential input current decreasing.

12. The amplifier as recited in claim 9 wherein said first sinh transconductor comprises:
   a first transistor coupled with said first terminal;
   a second transistor coupled with said first transistor and said second terminal;
   a third transistor coupled with said first transistor and said first terminal; and
   a fourth transistor coupled with said second transistor, said third transistor, and said second terminal.

13. The amplifier as recited in claim 8 wherein said first buffer further comprises:
   a fifth transistor coupled with said second transistor, wherein said second and fifth transistors form a first cascode;
   a sixth transistor coupled with said first, second, and fifth transistors;

a seventh transistor coupled with said third and fourth transistors; and an eighth transistor coupled with said third and seventh transistors, wherein said third and eighth transistors form a second cascode.

14. The amplifier as recited in claim 9 wherein a gain of said amplifier is controllable by an external feedback network.

15. The amplifier as recited in claim 9 wherein said amplifier is operable at frequencies up to 2 GHz.

16. An amplifier, comprising:

an input stage comprising a differential current input to a differential current output, wherein said differential current output is a reflection of the applied differential input current, wherein further said differential current output does not include a first order component due to a common mode voltage at said differential current input, and wherein further said input stage is operable to sense a first differential current and generate a second differential current based on said first differential current at said fully differential output;

a transimpedance stage coupled with said input stage and operable to receive said second differential current and generate a first differential voltage based on said second differential current; and an output stage coupled with said transimpedance stage and operable to receive said first differential voltage and generate a second differential voltage.

17. The amplifier as recited in claim 16 wherein a gain of said amplifier is controllable by an external feedback network.

18. The amplifier as recited in claim 16 wherein said amplifier is operable at frequencies up to 2 GHz.

19. The amplifier as recited in claim 16 wherein said transimpedance stage comprises:

a first folded cascode operable to increase a first voltage at a first node in response to said second differential current increasing and operable to decrease said first voltage at said first node in response to said second differential current decreasing; and a second folded cascode operable to decrease a second voltage at a second node in response to said second differential current increasing and operable to increase said first voltage at said first node in response to said second differential current decreasing.

20. A current feedback fully differential amplifier, comprising:

an input stage operable to sense a differential input current at a first terminal and a second terminal, said input stage comprising:

a first buffer having an input coupled with said first terminal and an output coupled with said second terminal; and a second buffer having an output coupled with said first terminal and said input of said first buffer, said second buffer also having an input coupled with said second terminal and said output of said first buffer;

wherein said amplifier is operable at frequencies up to 2 GHz.

21. The amplifier as recited in claim 20 wherein said first and second buffers bias each other.

22. The amplifier as recited in claim 20 wherein a gain of said amplifier is controllable by an external feedback network.

23. The amplifier as recited in claim 20 wherein said second buffer increases a first current and decreases a second current in response to said input current increasing, and wherein further said second buffer decreases said first current and increases said second current in response to said input current decreasing.

24. The amplifier as recited in claim 20 wherein said first buffer comprises:

a first transistor coupled with said first terminal;

a second transistor coupled with said first transistor and said second terminal;

a third transistor coupled with said first transistor and said first terminal; and a fourth transistor coupled with said second transistor, said third transistor, and said second terminal.

25. The amplifier as recited in claim 24 wherein the current through said second transistor increases and the current through said fourth transistor decreases in response to an increase in said input current, and wherein further the current through said second transistor decreases and the current through said fourth transistor increases in response to a decrease in said input current.

26. The amplifier as recited in claim 24 wherein said first buffer further comprises:

a fifth transistor coupled with said second transistor, wherein said second and fifth transistors form a first cascode;

a sixth transistor coupled with said first, second, and fifth transistors;

a seventh transistor coupled with said third and fourth transistors; and an eighth transistor coupled with said fourth and seventh transistors, wherein said fourth and eighth transistors form a second cascode.

* * * * *